(12) United States Patent
Xie

(10) Patent No.: US 10,205,027 B2
(45) Date of Patent: Feb. 12, 2019

(54) COPLANAR DOUBLE GATE ELECTRODE OXIDE THIN FILM TRANSISTOR AND MANUFACTURE METHOD THEREOF

(71) Applicant: Wuhan China Star Optoelectronics Technology Co., Ltd., Wuhan, Hubei (CN)

(72) Inventor: Yingtao Xie, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 55 days.

(21) Appl. No.: 15/328,201

(22) PCT Filed: Sep. 14, 2016

(86) PCT No.: PCT/CN2016/099064
§ 371 (c)(1),
(2) Date: Jan. 23, 2017

(87) PCT Pub. No.: WO2017/215138
PCT Pub. Date: Dec. 21, 2017

(65) Prior Publication Data
US 2018/0212062 A1    Jul. 26, 2018

(30) Foreign Application Priority Data
Jun. 13, 2016    (CN) .......................... 2016 1 0414032

(51) Int. Cl.
*H01L 27/14*    (2006.01)
*H01L 29/786*    (2006.01)
(Continued)

(52) U.S. Cl.
CPC ........ *H01L 29/78648* (2013.01); *H01L 21/34* (2013.01); *H01L 21/445* (2013.01);
(Continued)

(58) Field of Classification Search
CPC .............. H01L 21/445; H01L 27/1225; H01L 27/1262; H01L 27/127
(Continued)

(56) References Cited

U.S. PATENT DOCUMENTS 9,466,615 B2 * 10/2016 Miyairi ............... H01L 27/1225
9,640,567 B2 *  5/2017 Yang .................. H01L 27/1262
2014/0239267 A1  8/2014 Byun

FOREIGN PATENT DOCUMENTS

| CN | 102130009 A | 7/2011 |
|---|---|---|
| CN | 102651337 A | 8/2012 |
| CN | 105552025 A | 5/2016 |

* cited by examiner

Primary Examiner — Tan N Tran
(74) Attorney, Agent, or Firm — Andrew C. Cheng

(57) ABSTRACT

The present disclosure relates to a coplanar double gate electrode oxide thin film transistor, includes a substrate, a bottom gate electrode, a first gate electrode insulating layer, a oxide semiconductor layer, a source electrode contact area and a drain electrode contact area, a second gate electrode insulating layer and a top gate electrode, wherein, the upper surface of the substrate is recessed toward the inside of the substrate to form a groove, the bottom gate electrode is formed in the groove, so that the upper surface of the bottom gate electrode and the upper surface of the substrate are in the same horizontal plane. The thin film transistor of the present disclosure has the characteristics of the double gate electrode and the coplanar structure, and is capable of improving the stability of the thin film transistor, optimizing the response speed thereof, and lowering the driving voltage.

20 Claims, 2 Drawing Sheets

(51) Int. Cl.
*H01L 21/34* (2006.01)
*H01L 21/445* (2006.01)
*H01L 27/12* (2006.01)
*H01L 29/66* (2006.01)

(52) U.S. Cl.
CPC ........ *H01L 27/127* (2013.01); *H01L 27/1225* (2013.01); *H01L 27/1262* (2013.01); *H01L 27/1292* (2013.01); *H01L 29/66969* (2013.01); *H01L 29/786* (2013.01); *H01L 29/78603* (2013.01); *H01L 29/78693* (2013.01); *H01L 29/78633* (2013.01)

(58) Field of Classification Search
USPC ...................................... 257/43, 59, 72, 432
See application file for complete search history.

COPLANAR DOUBLE GATE ELECTRODE OXIDE THIN FILM TRANSISTOR AND MANUFACTURE METHOD THEREOF

FIELD OF THE DISCLOSURE

The present disclosure relates to a display technology field, and more particularly to a coplanar double gate electrode oxide thin film transistor and a manufacture method thereof.

BACKGROUND OF THE DISCLOSURE

The carrier mobility of the oxide semiconductor is 20 to 30 times that of the amorphous silicon, can greatly increase the charging and discharging rate of the TFT to the pixel electrode, the response speed of the pixels can be improved to achieve faster refresh rate, while a faster response also greatly increases the line scan rate of the pixels, making ultra-high resolution in the TFT-LCD possible. Therefore, the oxide thin film transistor technology is gradually becoming a powerful competitor of the next generation of display technology. However, there is an important constraint on the technology used in mass production of display panels—the stability is not sufficient, therefore, it is necessary to conduct in-depth study of the technology, improve and optimize the existing oxide thin film transistor structure, it has a more stable device performance.

SUMMARY OF THE DISCLOSURE

In order to overcome the shortcomings of the prior art, the object of the present disclosure is to provide a coplanar double gate electrode oxide thin film transistor and manufacture method thereof, By optimizing and improving the structure of the oxide thin film transistor and the manufacture method thereof, the device performance stability of the thin film transistor structure is improved, the response speed of the thin film transistor is improved, the process flow is optimized, and the production cost is reduced.

The present disclosure includes two aspects, the first aspect, the present disclosure provides a coplanar double gate electrode oxide thin film transistor, includes: a substrate; a bottom gate electrode formed on the upper surface of the substrate; a first gate electrode insulating layer formed on the bottom gate electrode; an oxide semiconductor layer formed on the first gate electrode insulating layer; a source contact area and a drain contact area formed on the both sides of the oxide semiconductor; a second gate electrode insulating layer formed on the oxide semiconductor layer; a top gate electrode formed on the second gate electrode insulating layer; wherein, the upper surface of the substrate is recessed toward the inside of the substrate to form a groove, the bottom gate electrode is formed in the groove, so that the upper surface of the bottom gate electrode and the upper surface of the substrate are in the same horizontal plane.

Further, the upper surface of the source contact area, the upper surface of the drain contact area and the upper surface of the oxide semiconductor layer are in the same horizontal plane.

[Source and drain electrode contact area formation method] further, the source electrode contact area and/or the drain electrode contact area are formed by plasma treating to the oxide semiconductor layer.

Optionally, the plasma treatment uses a mixture of one or both of the gases Ar and $H_2$.

[Interconnect layer+contact hole] further, the coplanar double gate electrode oxide thin film transistor further includes a interconnect layer formed on the top gate electrode, a contact hole formed in the interconnect layer, the contact hole exposing portion of the upper surface of the source electrode contact area and the upper surface of the drain electrode contact area.

[Source and drain electrode] further, the coplanar double gate electrode oxide thin film transistor further includes a source electrode and a drain electrode formed on the interconnect layer, the source electrode is in contact with the source electrode contact area through the contact hole, the drain electrode is in contact with the drain electrode contact area through the contact hole.

[Flattening layer] further, the coplanar double gate electrode oxide thin film transistor further includes a flattening layer formed on the interconnect layer, the source electrode and the drain electrode.

[ITO] further, the coplanar double gate electrode oxide thin film transistor further includes an ITO film layer formed on the flattening layer.

[Patterning] further, the bottom electrode is a patterned bottom gate electrode.

Further, the top gate electrode is a patterned top gate electrode.

Further, the oxide semiconductor layer is a patterned oxide semiconductor layer.

Further, the ITO film layer is a patterned ITO film layer.

[Material] further, the first gate electrode insulating layer is made of the SiOx or the aluminum oxide thin film.

Further, the second gate electrode insulating layer is made of the SiOx or the aluminum oxide thin film.

Further, the oxide semiconductor layer is made of the amorphous IGZO thin film.

Further, the interconnect layer is a combination of one or both of the SiOx thin film and the SiNx thin film.

The second aspect, the present disclosure further provides a manufacturing method for the coplanar double gate electrode oxide thin film transistor, includes the following steps:

preparing a substrate;

forming a bottom gate electrode on the substrate;

forming a first gate electrode insulating layer on the bottom gate electrode;

forming an oxide semiconductor layer on the first gate electrode insulating layer;

forming a source contact area and a drain contact area on the both sides of the oxide semiconductor layer;

forming a second gate insulating layer on the oxide semiconductor layer;

forming a top gate electrode on the second gate electrode insulating layer;

wherein, forming the bottom gate electrode on the substrate is patterning process to the substrate, so that the upper surface of the substrate is recessed toward the inside of the substrate to form a groove; forming the bottom gate electrode in the groove, so that the upper surface of the bottom gate electrode and the upper surface of the substrate are in the same horizontal plane.

Further, in the manufacturing method of the present disclosure, patterning processing the substrate and forming the groove by recess the upper surface of the substrate toward the inside of the substrate is coating photoresist, forming a bottom gate electrode pattern on the substrate through exposure and development; then, the substrate formed the groove having a depth is through etching the substrate without protected by the photoresist.

Optionally, in the manufacturing method of the present disclosure, the photoresist is positive photoresist or negative photoresist.

Optionally, in the manufacturing method of the present disclosure, the photoresist is a negative photoresist, forming the bottom gate electrode in the groove is forms the bottom gate electrode through magnetron sputtering method or thermal deposition method to remove the negative photoresist, so that the upper surface of the bottom gate electrode and the upper surface of the substrate are in the same horizontal plane.

Optionally, in the manufacturing method of the present disclosure, the photoresist is a positive photoresist, after forming the bottom gate electrode in the groove is to makes the substrate forming the groove having the depth, removing the positive photoresist, then forming the bottom gate electrode through the ink-jet printing method, so that the upper surface of the bottom gate electrode and the upper surface of the substrate are in the same horizontal plane.

[Etching] optionally, the etching is dry etching or wet etching.

[Removing photoresist] preferably, removing photoresist is accomplished by immersing the substrate in a de-gumming fluid.

Wherein, the de-gumming fluid is the fluid used to remove the photoresist, conventional degumming fluids may be used, for example, use the N-methyl-2-pyrrolidone (NMP) as the de-gumming fluid.

[Oxide semiconductor layer—specifically] further, in the manufacturing method of the present disclosure, after forming the oxide semiconductor layer on the first gate electrode insulating layer, patterning processing the oxide semiconductor layer to obtain the patterned oxide semiconductor layer.

[Top gate electrode—specifically] further, in the manufacturing method of the present disclosure, forming the top gate electrode on the second gate electrode insulating layer is forms the second metal layer on the second gate electrode insulating layer, patterning processing the second metal layer to obtain the patterned top gate electrode.

Further, patterning processing the second metal layer is coats the photoresist on the second metal layer, then exposes and develops in sequence to make the photoresist forming the pattern of the top gate electrode, then removing the second metal layer being not protected by the photoresist and the second gate electrode insulating layer being not protected by the photoresist through the etching method, finally removing the photoresist.

Preferably, removing the second metal layer being not protected by the photoresist and the second gate electrode insulating layer being not protected by the photoresist through the dry etching method or wet etching method.

Optionally, the photoresist may be removed by the lift-off method or by the plasma bombardment using oxygen.

[Source and drain electrode contact area—specifically] further, in the manufacturing method of the present disclosure, forming the source contact area and the drain contact area on the both sides of the oxide semiconductor is use the patterned top gate electrode as the protective layer to plasma treatment the oxide semiconductor layer, so that the oxide semiconductor layer being outside of the patterned top gate electrode protection is respectively forms the source contact area and the drain contact area.

Further, the upper surface of the source contact area, the upper surface of the drain contact area and the upper surface of the oxide semiconductor layer area in the same horizontal plane.

[Plasma treatment—specifically] further, in the manufacturing method of the present disclosure, the plasma treatment uses a mixture of one or both of the Ar and $H_2$.

[Interconnect layer+contact hole] further, in the manufacturing method of the present disclosure, further includes the following steps: forming the interconnect layer on the top gate electrode, patterning processing the interconnect layer, forming the contact hole in the interconnect layer, the contact hole exposes the portion of the upper surface of the source electrode contact area, the upper surface of the drain electrode contact area.

[Source and drain electrode] further, in the manufacturing method of the present disclosure, further includes the following steps: respectively forming the source electrode and the drain electrode on the interconnect layer, the source electrode is in contact with the source electrode contact area through the contact hole, the drain electrode is in contact with the drain electrode contact area through the contact hole.

[Flattening layer] further, in the manufacturing method of the present disclosure, further includes the following steps: forming the flattening layer on the interconnect layer, the source electrode and the drain electrode.

[ITO] further, in the manufacturing method of the present disclosure, further includes the following steps: forming the ITO film layer on the flattening layer, patterning processing the ITO film layer and forming the patterned ITO film layer.

[Material] further, in the manufacturing method of the present disclosure, the first gate electrode insulating is made of the SiOx or the aluminum oxide thin film.

Further, in the manufacturing method of the present disclosure, the second gate electrode insulating layer is made of the SiOx or the aluminum oxide thin film.

Further, in the manufacturing method of the present disclosure, the oxide semiconductor layer is made of the amorphous IGZO thin film.

Further, in the manufacturing method of the present disclosure, the interconnect layer is a combination of one or both of the SiOx thin film and the SiNx thin film.

Compared with the prior art, the advantages of the present disclosure are as follows:

First, the thin film transistor of the present disclosure is designed as a double gate electrode structure, wherein the bottom electrode and the top electrode may as the light blocking layer, effectively reducing the light affect the stability of the oxide film transistor (particularly the thin film transistor using the amorphous IGZO thin film as the oxide semiconductor layer). Otherwise, the bottom gate electrode has the opposite electric field to the top gate electrode, this can reduce the diffusion of the IGZO internal defects into the channel and also improve the electrical stability of the thin film transistor using the amorphous IGZO thin film as the oxide semiconductor layer, such as the voltage bias test and the current bias test.

Second, the source contact area, the drain contact area and the oxide semiconductor layer of the present disclosure are coplanar structure, rather than having the step difference structure, so that the portion of the source electrode contact area and the drain electrode contact area respectively overlapped between the gate electrode is less, can reduce the intrinsic capacitance of the thin film transistor, thereby reducing the RC delay and improve the response speed of thin film transistor.

Finally, the bottom gate electrode and the substrate are designed in a coplanar structure so that the first gate insulating layer and the second gate insulating layer are both flat and there is no problem of step coverage. Compared with the planar gate insulating layer, the gate insulating layer having a stepped structure is easily punctured with the insulating layer film at the step edge thereof, and it is generally necessary to increase the thickness of the gate insulating layer having the step structure in order to avoid the breakdown problem. In the present disclosure, since the gate insulating layer is planar and there is no breakdown problem at the step edge, the gate insulating layer can be designed to be relatively thin, thereby lowering the driving voltage and reducing the power consumption.

DETAILED DESCRIPTION OF PREFERRED EMBODIMENTS

Embodiment 1

Figure 1:
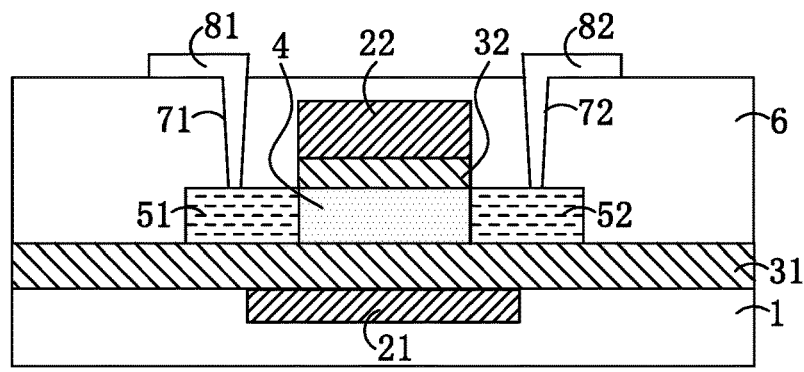
FIG. 1 is a schematic diagram of the coplanar double gate electrode oxide semiconductor thin film transistor of the Embodiment 1.

The present embodiment provides a coplanar double gate electrode oxide thin film transistor, as shown in FIG. 1, includes the following structure:

a substrate 1 at the bottom, the substrate 1 is provided with a groove which is recessed toward the inside of the substrate;

a patterned bottom gate electrode 21 formed in the groove of the substrate 1, and the upper surface of the bottom electrode 21 and the upper surface of the substrate 1 are in the same horizontal plane, so that the bottom gate electrode 21 and the substrate 1 form a coplanar structure;

a first gate electrode insulating layer 31 formed on the substrate 1 and the bottom electrode 21, the first gate electrode insulating layer is made of the SiOx or the aluminum oxide thin film as the insulating layer of the bottom gate electrode, due to the bottom gate electrode and the substrate are coplanar structure, the first gate electrode insulating layer has the planar structure, rather than the staircase structure;

a patterned oxide semiconductor layer 4 formed on the first gate electrode insulating layer 31, the oxide semiconductor layer is made of amorphous IGZO thin film;

a source electrode contact area 51 formed on the left side of the oxide semiconductor layer 4 and a drain electrode contact area 52 formed on the right side of the oxide semiconductor layer 4, the source electrode contact area and the drain electrode contact area are formed by after plasma-treating the oxide semiconductor layer, since the oxide semiconductor layer is subjected to plasma treatment, the conductivity of the oxide semiconductor layer can be increased, so that the source electrode contact area and the drain electrode contact area are formed;

a second gate electrode insulating layer 32 formed on the oxide semiconductor layer 4, the second gate electrode insulating layer is made of the SiOx or the aluminum oxide thin film.

a patterned top gate electrode 22 formed on the second gate electrode insulating layer 32.

an interconnect layer 6 formed on the first gate electrode insulating layer 31, the source electrode contact area 51, the drain electrode contact area 52 and the top gate electrode 22, a contact hole is formed in the interconnect layer 6; wherein, the contact hole includes a first contact hole 71 exposed the portion of the upper surface of the source electrode contact area 51 and a second contact hole 72 exposed the portion of the upper surface of the drain contact area 52;

a patterned source electrode 81 and a patterned drain electrode 82 formed on the interconnect layer 6 and in the contact hole; wherein, the source electrode 81 is in contact with the source electrode contact area 51 through the first contact hole 71, the drain electrode 82 is in contact with the drain electrode contact area 52 through the second contact hole 72.

In the present embodiment, in addition to the above structure, further may include a flattening layer and an ITO film layer sequentially formed on the interconnect layer, the source electrode and the drain electrode, these structures are conventionally employed in the prior art, and will not be described here.

In the coplanar double gate electrode oxide thin film transistor of the present embodiment, the thin film transistor has the double gate structure and the coplanar structure. Wherein, the bottom gate electrode and the top gate electrode in the double gate electrode structure can act as the light blocking layer, effectively reducing the light affect the stability of the oxide film transistor (particularly the thin film transistor using the amorphous IGZO thin film as the oxide semiconductor layer). Otherwise, the bottom gate electrode has the opposite electric field to the top gate electrode, this can reduce the diffusion of the IGZO internal defects into the channel and also improve the electrical stability of the thin film transistor using the amorphous IGZO thin film as the oxide semiconductor layer.

Otherwise, in the thin film transistor structure of the present embodiment, the source contact area, the drain contact area and the oxide semiconductor layer are designed to have a coplanar structure, rather than having the step difference structure, so that the portion of the source electrode contact area and the drain electrode contact area respectively overlapped between the gate electrode is less, can reduce the intrinsic capacitance of the thin film transistor, thereby reducing the RC delay and improve the response speed of thin film transistor.

Finally, the bottom gate electrode and the substrate are designed in a coplanar structure so that the first gate insulating layer and the second gate insulating layer are both flat and there is no problem of step coverage. Compared with the planar gate insulating layer, the gate insulating layer having a stepped structure is easily punctured with the insulating layer film at the step edge thereof, and it is generally necessary to increase the thickness of the gate insulating layer having the step structure in order to avoid the breakdown problem. In the present disclosure, since the gate insulating layer is planar and there is no breakdown problem at the step edge, the gate insulating layer can be designed to be relatively thin, thereby lowering the driving voltage and reducing the power consumption.

Figure 2A:
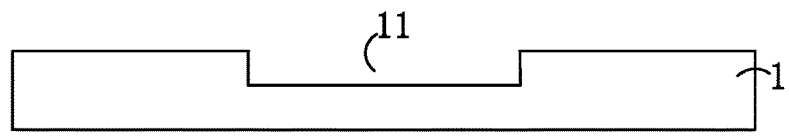
FIG. 2A to FIG. 2I is a process flow of the manufacturing method for the coplanar double gate electrode oxide semiconductor thin film transistor of the Embodiment 1.

The present embodiment further provides a manufacturing method for the double gate electrode oxide thin film transistor of the above, includes the following steps:

As shown in FIG. 2A, preparing a substrate 1, coating the photoresist on the substrate, and exposing and developing, forming a bottom gate electrode pattern on the substrate, removing the substrate not protected by the negative photoresist by dry etching or wet etching, so that the substrate 1 is formed with a groove 11 having a depth recessed toward the inside of the substrate, and forming a pattern of the bottom gate electrode in the groove.

Figure 2B:
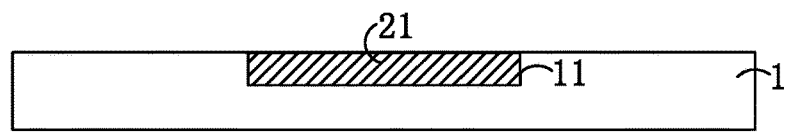

As shown in FIG. 2B, depositing a first metal layer in the groove 11 of the substrate by the magnetron sputtering or the thermal evaporation process, since the pattern of the bottom gate electrode is formed in the groove, the deposited first metal layer has a pattern, the patterned first metal layer is the patterned bottom gate electrode 21; next, the substrate 1 is immersed in the NMP de-adhesive to remove the negative photoresist so that the upper surface of the patterned bottom gate electrode 21 and the upper surface of the substrate 1 are at the same level, forming a coplanar structure.

Figure 2C:
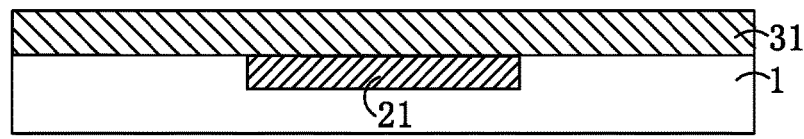

As shown in FIG. 2C, based on the chemical vapor deposition method of depositing a first gate electrode insulating layer 31 on the patterned bottom gate electrode 21 and substrate 1, the first gate electrode insulating layer is selected the SiOx or aluminum oxide thin film as the insulating layer of the bottom gate electrode. Since the bottom gate electrode has a coplanar structure with the substrate, the first gate insulating layer deposited over both is also a planar structure, whereas the non-conventional step structure.

Figure 2D:
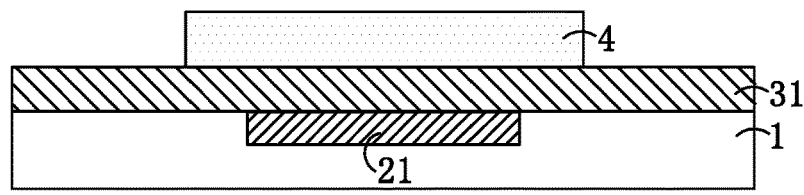

As shown in FIG. 2D, based on the chemical vapor deposition depositing the amorphous IGZO thin film on the first gate electrode insulating layer 31 as the oxide semiconductor layer 4, then patterning processing the oxide semiconductor 4 by the lithography process, forming the patterned oxide semiconductor layer 4, the patterned oxide semiconductor layer 4 also corresponding to the top of the bottom gate electrode 21 at the same time.

In the present embodiment, the lithography process refers to the following process flow: coating the photoresist on the film layer to be patterned, and sequentially exposing, developing, etching, removing photoresist, and finally realized the patterning treatment of the corresponding film layer. Wherein, the mask used for the exposure can be a normal mask, without the use of relatively high cost halftone mask. The film layer refers to the first metal layer, the oxide semiconductor, the ITO film layer, etc., in the conventional film layer structure of the thin film transistor.

Figure 2E:
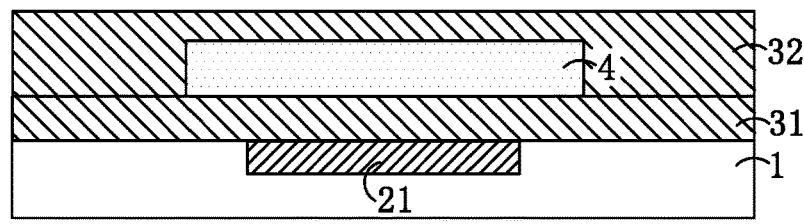

As shown in FIG. 2E, based on the chemical vapor deposition depositing the second gate electrode insulating layer 32 on the patterned oxide semiconductor layer 4 and the first gate electrode insulating layer 31, the second gate electrode insulating layer is selected the SiOx or the aluminum oxide thin film.

Figure 2F:
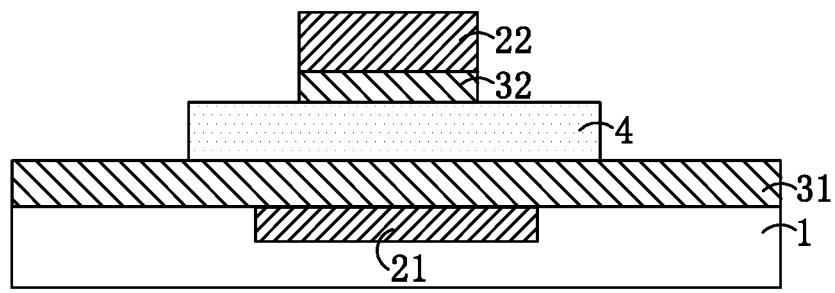
Figure 2G:
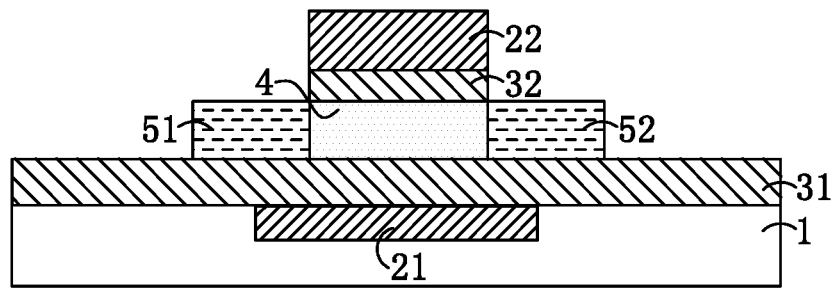

As shown in FIG. 2F, based on the chemical vapor deposition depositing the second metal layer on the second gate electrode insulating layer 32, patterning processing the second metal layer, specifically is: coating the photoresist (not shown) on the second metal layer, and sequentially exposing and developing, forming the patterned top gate electrode; removing the second metal layer which is not protected by the photoresist and the second gate electrode insulating layer 32 which is not protected by the photoresist by the dry etching or the wet etching; then, removing the photoresist by the lift-off method or by plasma bombardment using oxygen. Thereby, the patterned top gate electrode 22 is obtained while also removing the excess portion of the second gate insulating layer.

As shown in FIG. 4G, using the patterned top gate electrode 22 as the protective layer, $H_2$ or Ar plasma treating the patterned oxide semiconductor layer 4 out of the protection range of the top gate electrode 22, The electric conductivity of the oxide semiconductor layer exposed outside the protection range of the top gate electrode is increased, thereby forming the source electrode contact area 51 on the left side of the oxide semiconductor 4 and the drain electrode contact area 52 on the right side of the oxide semiconductor 4.

Figure 2H:
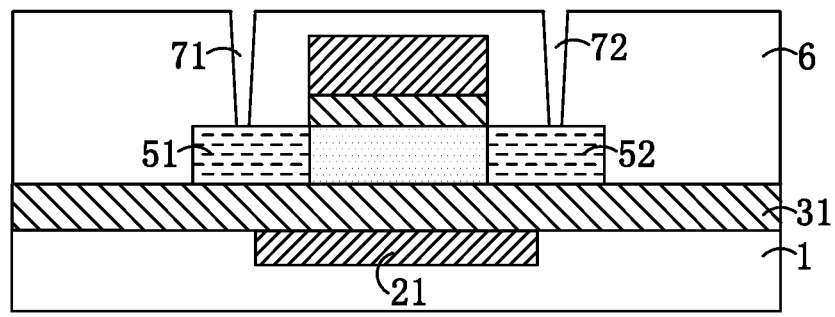

As shown in FIG. 2H, based on the chemical vapor deposition depositing the interconnect layer 6 on the first gate electrode insulating layer 31, the source electrode contact area 51, the drain electrode contact area 52 and the top gate electrode 22, the interconnect layer is selected the SiOx or the aluminum oxide thin film; processing the interconnect layer 6 by the lithography process, so that the interconnect layer 6 forming the first contact hole 71 and the second contact hole 72, wherein the first contact hole 71 exposes the upper surface of the source contact area 51, the second contact hole 72 exposes the upper surface of the drain electrode contact area 52.

Otherwise, in the present embodiment, the interconnect layer further can selected the thin film formed by the combination of SiNx thin film, SiOx and SiNx. When the SiNx thin film is selected for the interconnection layer, the above-described steps "using the patterned top gate electrode 22 as the protective layer, $H_2$ or Ar plasma treating the patterned oxide semiconductor layer 4 out of the protection range of the top gate electrode 22, The electric conductivity of the oxide semiconductor layer exposed outside the protection range of the top gate electrode is increased, thereby forming the source electrode contact area 51 on the left side of the oxide semiconductor 4 and the drain electrode contact area 52 on the right side of the oxide semiconductor 4" are not necessary.

Figure 2I:
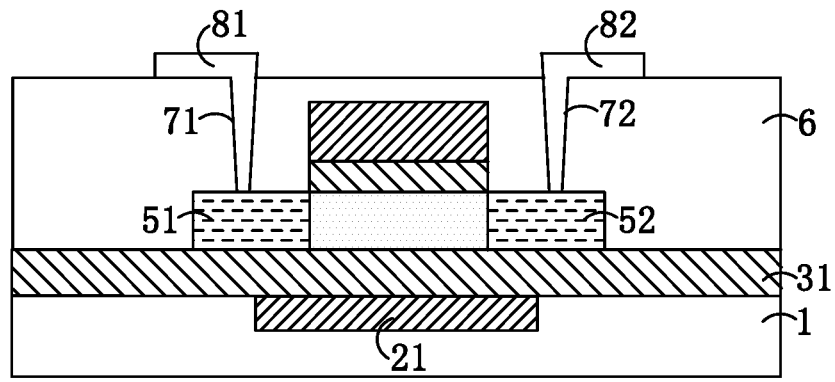

As shown in FIG. 2I, depositing the third metal layer on the interconnect layer 6 and in the first contact hole 71 and the second contact hole 72, processing the third metal layer by the lithography process, respectively forming the source electrode 81, the drain electrode 82, wherein the source electrode 81 is in contact with the source electrode contact area 51 through the contact hole 71, the drain electrode 82 is in contact with the drain electrode contact area 61 through the contact hole 72.

Otherwise, in the manufacturing method of the present embodiment, further includes the organic photoresist film deposited by the spin coating or printing method on the interconnect layer, the source electrode and the drain electrode, and the organic photoresist film is flattened and post-baked to obtain the flattening layer.

The manufacturing method of the present embodiment further includes forming the ITO film layer, and patterning processing the ITO film layer by the lithography process to obtain the patterned ITO film layer.

Embodiment 2

The present embodiment provides a method of manufacturing a coplanar double gate electrode oxide thin film transistor described in the Embodiment 2, this method differs from the manufacturing method described in Embodiment 2 only in the step of forming the coplanar structure between the patterned bottom gate electrode and the substrate, in particular:

Preparing a substrate, coating the positive photoresist on the substrate, and exposing and developing, forming the bottom gate electrode pattern on the substrate, removing the substrate not protected by the positive photoresist by the dry etching method or the wet etching method, the substrate is formed with a groove having a depth toward the inside of the substrate, and forming the pattern of the bottom gate electrode in the groove; then immersing the substrate in the de-gumming fluid to remove the positive photoresist.

Then, forming the patterned bottom gate electrode in the groove, by controlling the dose of the conductive ink drop, the bottom gate electrode and the substrate are at the same horizontal plane to form the coplanar structure. It will be understood that in the present embodiment, the dose of the conductive ink may be such that the bottom gate electrode and the substrate form a coplanar structure as long as the dose is sufficient to meet the actual situation.

The main structure of the coplanar double gate electrode oxide thin film transistor has been described above, the double gate electrode oxide thin film transistor may also include other conventional functional structures, and the present disclosure will not be described in detail herein.

The purpose of the specific embodiments of the present disclosure is to make it clear that the present disclosure and embodiments, is not limited to the embodiments of the present disclosure. Those of ordinary skill in the art that, in the above description of the change or changes may be made in various other forms. Here cannot be exhaustive of all embodiments. Changes or variations of the present disclosure is apparent to those who belong to the technical solution of the corollary is still in the column of the scope of the present disclosure.

What is claimed is:

1. A coplanar double gate electrode oxide thin film transistor, wherein, the coplanar double gate electrode oxide thin film transistor comprises: a substrate; a bottom gate electrode formed on the substrate; a first gate electrode insulating layer formed on the bottom gate electrode; an oxide semiconductor layer formed on the first gate electrode insulating layer; a source contact area and a drain contact area formed on both sides of the oxide semiconductor layer; a second gate electrode insulating layer formed on the semiconductor layer; a top gate electrode formed on the second gate electrode insulating layer; wherein, the upper surface of the substrate is recessed toward the inside of the substrate to form a groove, the bottom gate electrode is formed in the groove, so that the upper surface of the bottom gate electrode and the upper surface of the substrate are in the same horizontal plane, wherein the bottom gate electrode is larger than the top gate electrode in a direction extended from the source contact area to the drain contact area, a part of source contact area covers a part of the bottom gate electrode, and the source contact area is not covered by the top gate electrode.

2. The coplanar double gate electrode oxide thin film transistor according to claim 1, wherein, the upper surface of the source contact area, the upper surface of the drain contact area and the upper surface of the oxide semiconductor layer are in the same horizontal plane.

3. The coplanar double gate electrode oxide thin film transistor according to claim 2, wherein, the source contact area and/or the drain contact area are formed by plasma-treating the oxide semiconductor layer.

4. The coplanar double gate electrode oxide thin film transistor according to claim 1, wherein, the source contact area and/or the drain contact area are formed by plasma-treating the oxide semiconductor layer.

5. A manufacturing method for a coplanar double gate electrode oxide thin film transistor, wherein, comprises the following steps: preparing a substrate; forming a bottom gate electrode on the substrate; forming a first gate electrode insulating layer on the bottom gate electrode; forming an oxide semiconductor layer on the first gate electrode insulating layer; forming a source contact area and a drain contact area on the both sides of the oxide semiconductor layer; forming a second gate insulating layer on the oxide semiconductor layer; forming a top gate electrode on the second gate electrode insulating layer; wherein, forming the bottom gate electrode on the substrate is patterning process to the substrate, so that the upper surface of the substrate is recessed toward the inside of the substrate to form a groove; forming the bottom gate electrode in the groove, so that the upper surface of the bottom gate electrode and the upper surface of the substrate are in the same horizontal plane, wherein the bottom gate electrode is larger than the top gate electrode in a direction extended from the source contact area to the drain contact area, a part of source contact area covers a part of the bottom gate electrode, and the source contact area is not covered by the top gate electrode.

6. The manufacturing method according to claim 5, wherein, patterning processing the substrate and forming the groove by recess the upper surface of the substrate toward the inside of the substrate is coating a photoresist, forming a bottom gate electrode pattern on the substrate through exposure and development; then, the substrate formed the groove having a depth is through etching the substrate without protected by the photoresist.

7. The manufacturing method according to claim 6, wherein, the photoresist is a negative photoresist, forming the bottom gate electrode in the groove is forms the bottom gate electrode through magnetron sputtering method or thermal deposition method to remove the negative photoresist, so that the upper surface of the bottom gate electrode and the upper surface of the substrate are in the same horizontal plane.

8. The manufacturing method according to claim 7, wherein, forming the top gate electrode on the second gate electrode insulating layer is forming a second metal layer on the second gate electrode insulating layer, and pattern processing the second metal layer to form a patterned top gate electrode.

9. The manufacturing method according to claim 8, wherein, forming the source contact area and the drain contact area on the both sides of the oxide semiconductor is use the patterned top gate electrode as the protective layer to plasma treatment the oxide semiconductor layer, so that the oxide semiconductor layer being outside of the patterned top gate electrode protection is respectively forms the source contact area and the drain contact area.

10. The manufacturing method according to claim 9, wherein, the upper surface of the source contact area, the upper surface of the drain contact area and the upper surface of the oxide semiconductor layer area in the same horizontal plane.

11. The manufacturing method according to claim 6, wherein, the photoresist is a positive photoresist, after forming the bottom gate electrode in the groove is to makes the substrate forming the groove having the depth, removing the positive photoresist, then forming the bottom gate electrode through the ink-jet printing method, so that the upper surface of the bottom gate electrode and the upper surface of the substrate are in the same horizontal plane.

12. The manufacturing method according to claim 11, wherein, forming the top gate electrode on the second gate electrode insulating layer is forming a second metal layer on the second gate electrode insulating layer, and pattern processing the second metal layer to form a patterned top gate electrode.

13. The manufacturing method according to claim 12, wherein, forming the source contact area and the drain contact area on the both sides of the oxide semiconductor is use the patterned top gate electrode as the protective layer to plasma treatment the oxide semiconductor layer, so that the oxide semiconductor layer being outside of the patterned top gate electrode protection is respectively forms the source contact area and the drain contact area.

14. The manufacturing method according to claim 13, wherein, the upper surface of the source contact area, the upper surface of the drain contact area and the upper surface of the oxide semiconductor layer area in the same horizontal plane.

15. The manufacturing method according to claim 6, wherein, forming the top gate electrode on the second gate electrode insulating layer is forming a second metal layer on the second gate electrode insulating layer, and pattern processing the second metal layer to form a patterned top gate electrode.

16. The manufacturing method according to claim 15, wherein, forming the source contact area and the drain contact area on the both sides of the oxide semiconductor is use the patterned top gate electrode as the protective layer to plasma treatment the oxide semiconductor layer, so that the oxide semiconductor layer being outside of the patterned top gate electrode protection is respectively forms the source contact area and the drain contact area.

17. The manufacturing method according to claim 16, wherein, the upper surface of the source contact area, the upper surface of the drain contact area and the upper surface of the oxide semiconductor layer area in the same horizontal plane.

18. The manufacturing method according to claim 5, wherein, forming the top gate electrode on the second gate electrode insulating layer is forming a second metal layer on the second gate electrode insulating layer, and pattern processing the second metal layer to form a patterned top gate electrode.

19. The manufacturing method according to claim 18, wherein, forming the source contact area and the drain contact area on the both sides of the oxide semiconductor is use the patterned top gate electrode as the protective layer to plasma treatment the oxide semiconductor layer, so that the oxide semiconductor layer being outside of the patterned top gate electrode protection is respectively forms the source contact area and the drain contact area.

20. The manufacturing method according to claim 19, wherein, the upper surface of the source contact area, the upper surface of the drain contact area and the upper surface of the oxide semiconductor layer area in the same horizontal plane.

* * * * *